United States Patent
He et al.

(10) Patent No.: US 12,293,080 B2
(45) Date of Patent: May 6, 2025

(54) MULTIPLE MEMORY BLOCK ERASE OPERATION

(71) Applicant: Micron Technology, Inc., Boise, ID (US)

(72) Inventors: Deping He, Boise, ID (US); Caixia Yang, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 18/233,433

(22) Filed: Aug. 14, 2023

(65) Prior Publication Data

US 2024/0069733 A1 Feb. 29, 2024

Related U.S. Application Data

(60) Provisional application No. 63/401,851, filed on Aug. 29, 2022.

(51) Int. Cl.
*G06F 12/00* (2006.01)
*G06F 3/06* (2006.01)

(52) U.S. Cl.
CPC .......... *G06F 3/061* (2013.01); *G06F 3/0659* (2013.01); *G06F 3/0679* (2013.01)

(58) Field of Classification Search
None
See application file for complete search history.

(56) References Cited

U.S. PATENT DOCUMENTS

| 2012/0201082 A1* | 8/2012 | Choy ............... G11C 16/16 365/185.19 |
| 2018/0102172 A1* | 4/2018 | Yi .................... G11C 16/16 |
| 2018/0203774 A1* | 7/2018 | Srinivasan ......... G11C 16/3459 |

* cited by examiner

*Primary Examiner* — Daniel D Tsui
(74) *Attorney, Agent, or Firm* — Lowenstein Sandler LLP

(57) ABSTRACT

A memory sub-system to initiate an erase operation to erase a first set of memory cells of a first memory block and a second set of memory cells of a second memory block of a memory device. One or more erase pulses of the erase operation are caused to be applied to the first set of memory cells of the first memory block and the second set of memory cells of the second memory block concurrently. A first erase verify sub-operation of the erase operation is caused to be performed to verify the first memory block is erased and a second erase verify sub-operation of the erase operation is caused to be performed to verify the second memory block is erased.

18 Claims, 12 Drawing Sheets

FIG. 3

MULTIPLE MEMORY BLOCK ERASE OPERATION

CROSS-REFERENCE TO RELATED APPLICATION

This application claims the benefit of U.S. Provisional Application No. 63/401,851, titled "Multiple Memory Block Erase Operation," filed Aug. 29, 2022, which is hereby incorporated herein by reference in its entirety.

TECHNICAL FIELD

Embodiments of the disclosure relate generally to memory sub-systems, and more specifically, relate to executing an erase operation to erase memory cells of multiple memory blocks of a memory device in a memory sub-system.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The present disclosure will be understood more fully from the detailed description given below and from the accompanying drawings of various embodiments of the disclosure.

FIG. 3 is a block schematic of a portion of an array of memory cells as could be used in a memory of the type described with reference to FIG. 1B according to an embodiment.

DETAILED DESCRIPTION

Figure 1A:
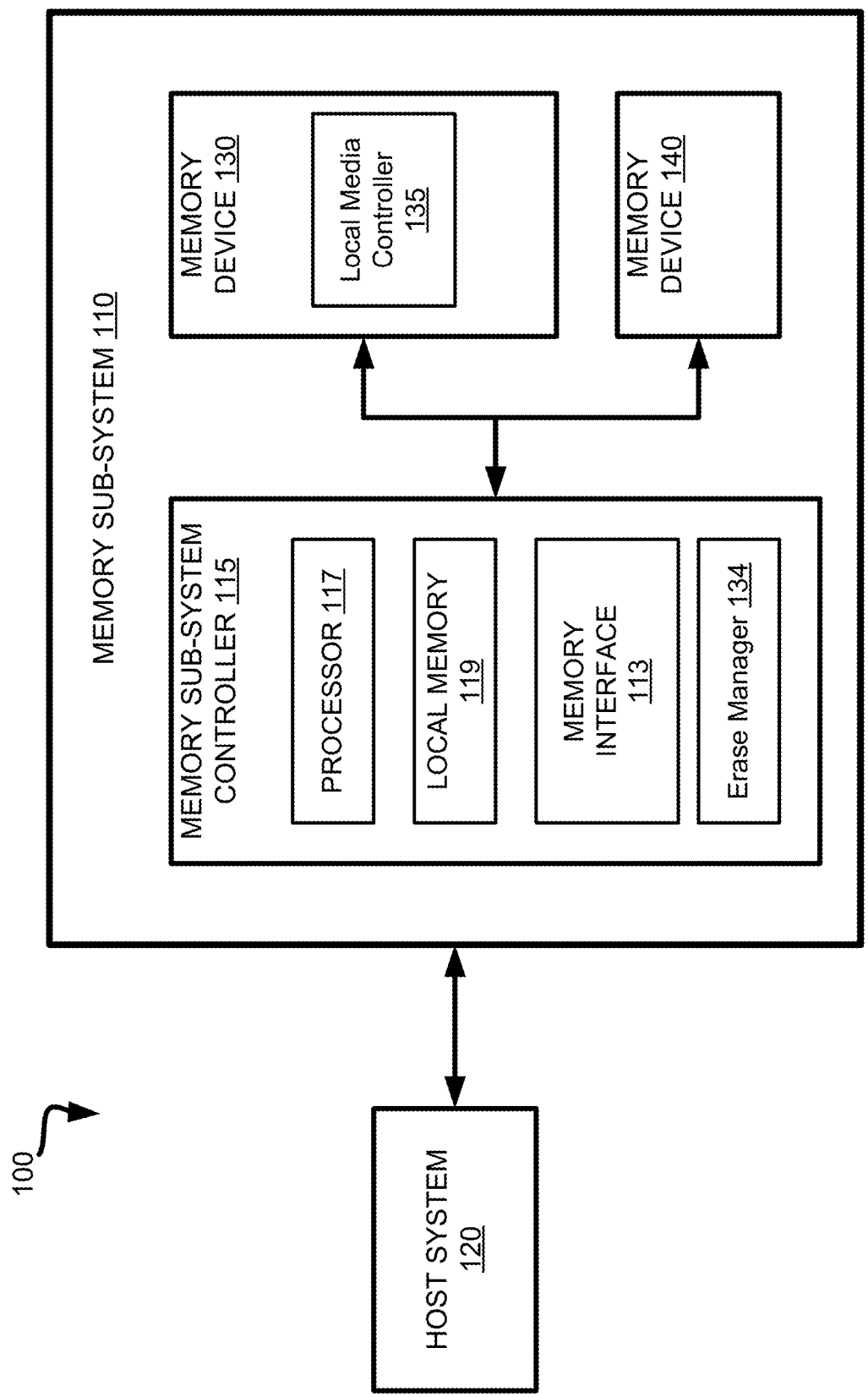
FIG. 1A illustrates an example computing system that includes a memory sub-system in accordance with some embodiments.

Aspects of the present disclosure are directed to executing an erase operation to erase memory cells of multiple memory blocks of a memory device in a memory sub-system. A memory sub-system can be a storage device, a memory module, or a hybrid of a storage device and memory module. Examples of storage devices and memory modules are described below in conjunction with FIG. 1A. In general, a host system can utilize a memory sub-system that includes one or more components, such as memory devices that store data. The host system can provide data to be stored at the memory sub-system and can request data to be retrieved from the memory sub-system.

A memory sub-system can include high density non-volatile memory devices where retention of data is desired when no power is supplied to the memory device. One example of non-volatile memory devices is a negative-and (NAND) memory device. Other examples of non-volatile memory devices are described below in conjunction with FIGS. 1A-1B. A non-volatile memory device is a package of one or more dies. Each die includes one or more planes. For some types of non-volatile memory devices (e.g., NAND devices), each plane includes a set of physical blocks. Each block consists of a set of pages. Each page includes a set of memory cells. A memory cell is an electronic circuit that stores information. Depending on the memory cell type, a memory cell can store one or more bits of binary information, and has various logic states that correlate to the number of bits being stored. The logic states can be represented by binary values, such as "0" and "1", or combinations of such values.

A memory device (e.g., a memory die) can include multiple memory cells arranged in a two-dimensional or three-dimensional grid. The memory cells are formed onto a silicon wafer in an array of columns (interconnected by conductive lines which are also hereinafter referred to as bitlines) and rows (interconnected by conductive lines which are also hereinafter referred to as wordlines). A wordline can refer to one or more conductive lines of a memory device that are used with one or more bitlines to generate the address of each of the memory cells. The intersection of a bitline and wordline constitutes the address of the memory cell. A block hereinafter refers to a unit of the memory device used to store data and can include a group of memory cells, a wordline group, a wordline, or individual memory cells. One or more blocks can be grouped together to form a plane of the memory device in order to allow concurrent operations to take place on each plane. The memory device can include circuitry that performs concurrent memory page accesses of two or more memory planes. For example, the memory device can include a respective access line driver circuit and power circuit for each plane of the memory device to facilitate concurrent access of pages of two or more memory planes, including different page types. For ease of description, these circuits can be generally referred to as independent plane driver circuits. Control logic on the memory device includes a number of separate processing threads to perform concurrent memory access operations (e.g., read operations, program operations, and erase operations). For example, each processing thread corresponds to a respective one of the memory planes and utilizes the associated independent plane driver circuits to perform the memory access operations on the respective memory plane.

As these processing threads operate independently, the power usage and requirements associated with each processing thread also varies.

A memory block hereinafter refers to a unit of the memory device used to store data and can include a group of memory cells, a wordline group, a wordline, or individual memory cells. Each block can include a number of sub-blocks, where each sub-block is defined by an associated pillar (e.g., a vertical conductive trace) extending from a shared bitline. Memory pages (also referred to herein as "pages") store one or more bits of binary data corresponding to data received from the host system. To achieve high density, a string of memory cells in a non-volatile memory device can be constructed to include a number of memory cells at least partially surrounding a pillar of poly-silicon channel material (i.e., a channel region). The memory cells can be coupled to access lines (i.e., wordlines) often fabricated in common with the memory cells, so as to form an array of strings in a block of memory (e.g., a memory array). The compact nature of certain non-volatile memory devices, such as 3D flash NAND memory, means wordlines are common to many memory cells within a block of memory. Some memory devices use certain types of memory cells, such as triple-level cell (TLC) memory cells, which store three bits of data in each memory cell, which make it affordable to move more applications from legacy hard disk drives to newer memory sub-systems, such as NAND solid-state drives (SSDs).

Some memory devices can be three-dimensional (3D) memory devices (e.g., 3D NAND devices). For example, a 3D memory device can include memory cells that are placed between sets of layers including a pillar (e.g., polysilicon pillar), a tunnel oxide layer, a charge trap (CT) layer, and a dielectric (e.g., oxide) layer. A 3D memory device can have a "top deck" corresponding to a first side and a "bottom deck" corresponding to a second side. Without loss of generality, the first side can be a drain-side and the second side can be a source-side. For example, a 3D memory device can be a 3D replacement gate memory device having a replacement gate structure using wordline stacking.

A memory cell ("cell") can be programmed (written to) by applying a certain voltage to the cell, which results in an electric charge being held by the cell. For example, a voltage signal $V_{CG}$ that can be applied to a control electrode of the cell to open the cell to the flow of electric current across the cell, between a source electrode and a drain electrode. More specifically, for each individual cell (having a charge Q stored thereon) there can be a threshold control gate voltage $V_T$ (also referred to as the "threshold voltage") such that the source-drain electric current is low for the control gate voltage ($V_{CG}$) being below the threshold voltage, $V_{CG} < V_T$. The current increases substantially once the control gate voltage has exceeded the threshold voltage, $V_{CG} > V_T$. Because the actual geometry of the electrodes and gates varies from cell to cell, the threshold voltages can be different even for cells implemented on the same die. The cells can, therefore, be characterized by a distribution P of the threshold voltages, $P(Q,V_T)=dW/dV_T$, where dW represents the probability that any given cell has its threshold voltage within the interval $[V_T, V_T+dV_T]$ when charge Q is placed on the cell.

One type of cell is a single level cell (SLC), which stores 1 bit per cell and defines 2 logical states ("states") ("1" or "L0" and "0" or "L1") each corresponding to a respective $V_T$ level. For example, the "1" state can be an erased state and the "0" state can be a programmed state (L1). Another type of cell is a multi-level cell (MLC), which stores 2 bits per cell and defines 4 states ("11" or "L0", "10" or "L1", "01" or "L2" and "00" or "L3") each corresponding to a respective $V_T$ level. For example, the "11" state can be an erased state and the "01", "10" and "00" states can each be a respective programmed state. Another type of cell is a triple level cell (TLC), which stores 3 bits per cell and defines 8 states ("111" or "L0", "110" or "L1", "101" or "L2", "100" or "L3", "011" or "L4", "010" or "L5", "001" or "L6", and "000" or "L7") each corresponding to a respective $V_T$ level. For example, the "111" state can be an erased state and each of the other states can be a respective programmed state. Another type of a cell is a quad-level cell (QLC), which stores 4 bits per cell and defines 16 states L0-L15, where L0 corresponds to "1111" and L15 corresponds to "0000". Another type of cell is a penta-level cell (PLC), which stores 5 bits per cell and defines 32 states. Other types of cells are also contemplated. A memory device can include one or more arrays of memory cells such as SLCs, MLCs, TLCs, QLCs, PLCs, etc. or any combination of such. For example, a memory device can include an SLC portion, and an MLC portion, a TLC portion, a QLC portion, or a PLC portion of cells.

The array of memory cells is arranged such that the control gate of each memory cell of a row of the array is connected to a wordline. Columns of the array include strings (often termed "strings") of memory cells connected together in series, source to drain, between a pair of select lines, a source select line and a drain select line. The source select line includes a source select gate at each intersection between a NAND string and the source select line, and the drain select line includes a drain select gate at each intersection between a NAND string and the drain select line. The select gates are typically field-effect transistors. Each source select gate is connected to a source line, while each drain select gate is connected to a column bitline.

A memory cell programming operation, which can be performed in response to receiving a write command from the host, can involve sequentially applying programming voltage pulses to a selected wordline that is coupled to the target memory page. Conversely, before a new value can be stored in a previously programmed memory cell, the memory cell is erased as part of a program/erase (PE) cycle.

In these memory devices, when performing an erase operation on memory cells of one or more strings (or sub-block) of a single memory block that are to be erased (also referred to as "target memory cells" of a "target memory block"), an erase pulse is applied to the a memory line (e.g., a wordline coupled to a string of memory cells) to ramp voltages of a selected string of the memory cells up to the erase voltage (Vera), at which voltage level the memory cells can be completely erased. Further, it is common to erase an entire block of multiple strings of memory cells at the same time. The erase voltage is typically greater than a particular voltage, e.g., than typical programming voltages.

Erase operations are performed on a per-block basis, thus erasing all memory pages of the block. During an erase operation, a series of loops or erase pulses are applied to ramp the target memory cells to a maximum or final erase voltage level (Vera), such as approximately 16V to approximately 22V. For certain low density universal flash storage devices having one or two memory devices (i.e., one or two memory dies) in the memory sub-system, the erase time (Terase) associated with erasing a single memory block per erase operation contributes a significant portion of the overall memory device operating time.

For example, a memory device having a number of memory pages (e.g., SLC memory pages) per block may have a programming time (Tprog) per memory page, which results in a memory block programming time equivalent to the time per page times the number of pages. In this example, if an erase operation is performed per memory block (e.g., a memory block having a first size), the throughput impact associated with the erase time (e.g., a Terase per erase operation executed on each memory block) is approximately equal to the Tprog minus (Tprog+Terase) or XIVIB/s. Typical memory device sub-systems support erase operations that enable the erasing of a single memory block per memory plane. In such systems, the erase operation is executed to erase the size of a single memory block. However, the single block erase operation can cause a significant throughput impact (e.g., approximately XMB/s) to the memory device.

According to aspects of the present disclosure, a multi-block erase operation is executed to erase multiple memory blocks concurrently. In an embodiment, the multi-block erase operation includes application of a series of erase pulses to a set of target memory cells associated with multiple memory blocks (e.g., a first target memory block to be erased and second target memory block to be erased). According to embodiments, the erase pulses of the multi-block erase operation are applied concurrently to both the first target memory block to be erased (also referred to as a "first target memory block") and the second target memory block to be erased (also referred to as a "second target memory block") concurrently. According to embodiments, the multi-block erase operation can be executed to erase multiple memory blocks of multiple different memory planes (e.g., a first target memory block of Plane 0 and a second target memory block of Plane 1).

Advantageously, a single multi-block erase operation enables a larger portion of the array of memory cells of a memory device (e.g., memory cells of multiple memory blocks) to be erased concurrently. For example, the multi-block erase operation can be issued to erase approximately 2× MB (e.g., the size of two memory blocks), which results in a reduction of the throughput impact of approximately 50%, as compared to an erase operation of a single memory block. Advantages of the multi-block erase operation include a reduction in the throughput impact of erasing target memory cells, particularly for low density universal flash storage devices. Use of the multi-block erase operation to erase memory blocks of multiple different memory planes provides for improved memory sub-system performance since erase time overhead is reduced during execution of the dual plane erase operation.

FIG. 1A illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

A memory sub-system 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory sub-systems 110. In some embodiments, the host system 120 is coupled to different types of memory sub-system 110. FIG. 1A illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), a double data rate (DDR) memory bus, Small Computer System Interface (SCSI), a dual in-line memory module (DIMM) interface (e.g., DIMM socket interface that supports Double Data Rate (DDR)), etc. The physical host interface can be used to transmit data between the host system 120 and the memory sub-system 110. The host system 120 can further utilize an NVM Express (NVMe) interface to access components (e.g., memory devices 130) when the memory sub-system 110 is coupled with the host system 120 by the physical host interface (e.g., PCIe bus). The physical host interface can provide an interface for passing control, address, data, and other signals between the memory sub-system 110 and the host system 120. FIG. 1A illustrates a memory sub-system 110 as an example. In general, the host system 120 can access multiple memory sub-systems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, or any combination of such. In some embodiments, a particular memory device can include an SLC portion, and an MLC portion, a TLC portion, a QLC portion, or a PLC portion of memory cells. The memory cells of the memory devices 130 can be grouped as pages that can refer to a logical unit of the memory device used to store data. With some types of memory (e.g., NAND), pages can be grouped to form blocks. In one embodiment, the term "MLC memory" can be used to represent any type of memory cell that stores more than one bit per cell (e.g., 2 bits, 3 bits, 4 bits, or 5 bits per cell).

Although non-volatile memory components such as 3D cross-point array of non-volatile memory cells and NAND type flash memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations. The memory sub-system controller 115 can include hardware such as one or more integrated circuits and/or discrete components, a buffer memory, or a combination thereof. The hardware can include a digital circuitry with dedicated (i.e., hard-coded) logic to perform the operations described herein. The memory sub-system controller 115 can be a microcontroller, special purpose logic circuitry (e.g., a field programmable gate array (FPGA), an application specific integrated circuit (ASIC), etc.), or other suitable processor.

The memory sub-system controller 115 can be a processing device, which includes one or more processors (e.g., processor 117), configured to execute instructions stored in a local memory 119. In the illustrated example, the local memory 119 of the memory sub-system controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1A has been illustrated as including the memory sub-system controller 115, in another embodiment of the present disclosure, a memory sub-system 110 does not include a memory sub-system controller 115, and can instead rely upon external control (e.g., provided by an external host, or by a processor or controller separate from the memory sub-system).

In general, the memory sub-system controller 115 can receive commands or operations from the host system 120 and can convert the commands or operations into instructions or appropriate commands to achieve the desired access to the memory devices 130. The memory sub-system controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory sub-system controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the memory sub-system controller 115 and decode the address to access the memory devices 130.

In some embodiments, the memory devices 130 include local media controllers 135 that operate in conjunction with memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, memory sub-system 110 is a managed memory device, which includes a raw memory device 130 having control logic (e.g., local media controller 135) on the die and a controller (e.g., memory sub-system controller 115) for media management within the same memory device package. An example of a managed memory device is a managed NAND (MNAND) device.

In one embodiment, the memory sub-system 110 includes a memory interface component 113. Memory interface component 113 is responsible for handling interactions of memory sub-system controller 115 with the memory devices of memory sub-system 110, such as memory device 130. For example, memory interface component 113 can send memory access commands corresponding to requests received from host system 120 to memory device 130, such as program commands, read commands, or other commands. In addition, memory interface component 113 can receive data from memory device 130, such as data retrieved in response to a read command or a confirmation that a program command was successfully performed. For example, the memory sub-system controller 115 can include a processor 117 (processing device) configured to execute instructions stored in local memory 119 for performing the operations described herein.

In one embodiment, memory device 130 includes an erase manager 134 configured to carry out corresponding memory access operations, in response to receiving the memory access commands from memory interface 113. In some embodiments, the memory sub-system controller 115 includes at least a portion of erase manager 134 and is configured to perform the functionality described herein. In some embodiments, erase manager 134 is implemented on memory device 130 using firmware, hardware components, or a combination of the above. In one embodiment, erase manager 134 receives, from a requestor, such as memory interface 113, a request to erase data from a set of target memory cells of a memory array of memory device 130. The memory array can include an array of memory cells formed at the intersections of wordlines and bitlines. In one embodiment, the memory cells are grouped into blocks, which can be further divided into sub-blocks, where a given wordline is shared across a number of sub-blocks, for example. In one embodiment, each sub-block corresponds to a separate plane in the memory array. The group of memory cells associated with a wordline within a sub-block is referred to as a physical page. In one embodiment, there can be multiple portions of the memory array, such as a first portion where the sub-blocks are configured as SLC memory and a second portion where the sub-blocks are configured as multi-level cell (MLC) memory (i.e., including memory cells that can store two or more bits of information per cell). For example, the second portion of the memory array can be configured as TLC memory. The voltage levels of the memory cells in TLC memory form a set of eight (8) programming distributions representing the 8 different combinations of the three bits stored in each memory cell. Depending on how the memory cells are configured, each physical page in one of the sub-blocks can include multiple page types. For example, a physical page formed from single level cells (SLCs) has a single page type referred to as a lower logical page (LP). Multi-level cell (MLC) physical page types can include LPs and upper logical pages (UPs), TLC physical page types are LPs, UPs, and extra logical pages (XPs), and QLC physical page types are LPs, UPs, XPs and top logical pages (TPs). For example, a physical page formed from memory cells of the QLC memory type can have a total of four logical pages, where each logical page can store data distinct from the data stored in the other logical pages associated with that physical page.

In one embodiment, erase manager 134 can execute a multi-block erase operation to erase multiple memory blocks concurrently. In an embodiment, the erase manager 134 initiates execution of the multi-block erase operation to erase a set of target memory cells of a first target memory block and a second target memory block of the memory device 130. In an embodiment, the erase manager 134 can initiate the multi-block erase operation including the issuance of a first command to identify first address information associated with memory cells of a first target memory block to be erased and second address information associated with memory cells of a second target memory block to be erased. After the address information relating to the first target memory block and the second target memory block is identified, the erase manager 134 can issue a second command to send the identified address information to the memory device 130 to prepare the memory device 130 for the set of erase pulses of the multi-block erase operation.

In an embodiment, the erase manager 134 causes a set of one or more erase pulses to be applied to the first target memory block and the second target memory block concurrently. In an embodiment, the erase pulses can have incrementally increasing voltage levels until an erase voltage level (Vera) is reached on the target memory cells. In an embodiment, the multi-block erase operation can include one or more sub-operations. Optionally, in an embodiment, prior to the application of the erase pulses, the erase manager 134 can apply a pre-program pulse to the target memory cells of the first target memory block and the second target memory block. In an embodiment, following each of the erase pulses, the multi-block erase operation can include an erase verify sub-operation to determine if the erase voltage level has been reached and the target memory cells have been erased.

Figure 1B:
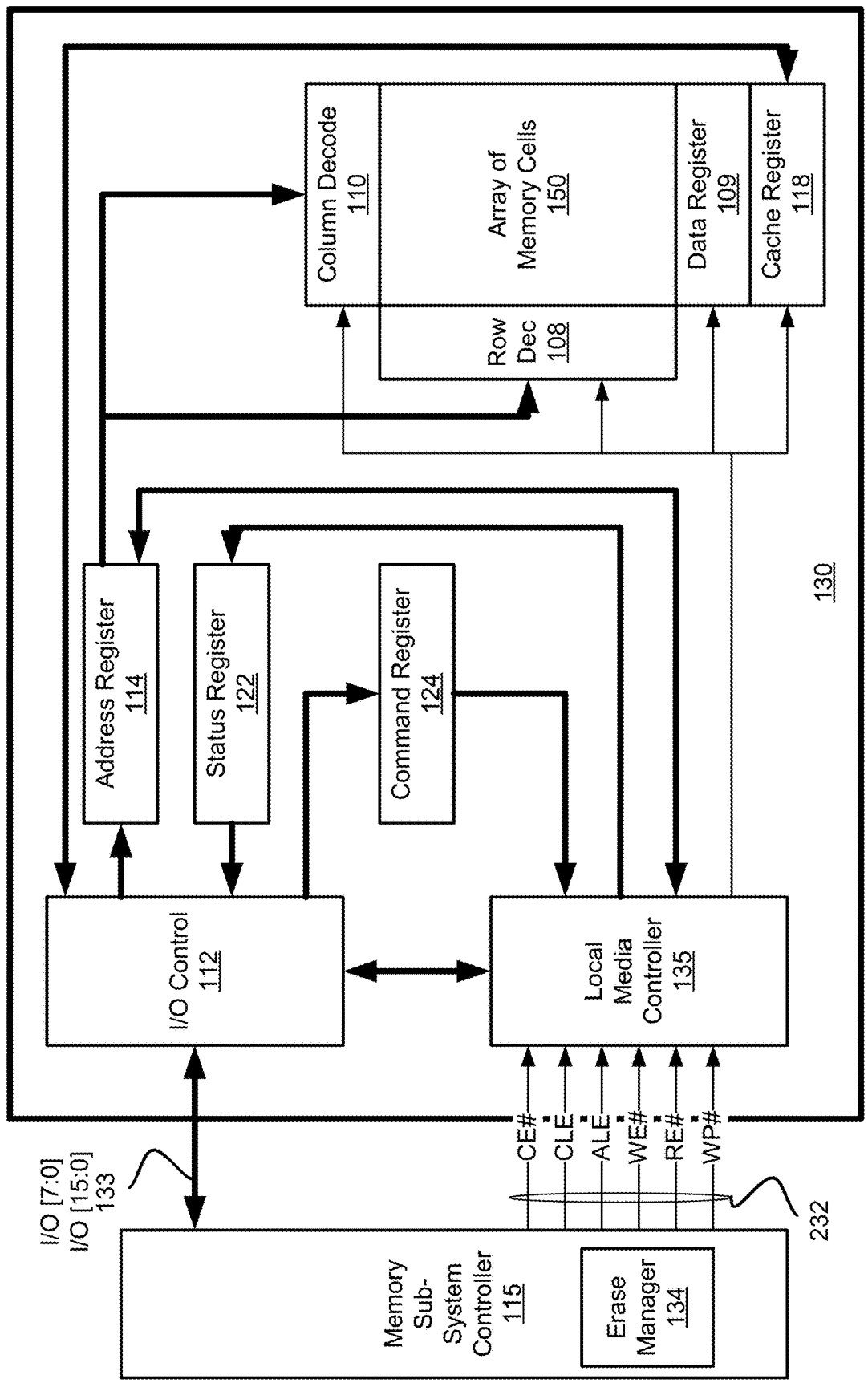
FIG. 1B is a block diagram of a memory device in communication with a memory sub-system controller of a memory sub-system according to an embodiment.

FIG. 1B is a simplified block diagram of a first apparatus, in the form of a memory device 130, in communication with a second apparatus, in the form of a memory sub-system controller 115 of a memory sub-system (e.g., memory sub-system 110 of FIG. 1A), according to an embodiment. Some examples of electronic systems include personal computers, personal digital assistants (PDAs), digital cameras, digital media players, digital recorders, games, appliances, vehicles, wireless devices, mobile telephones and the like. The memory sub-system controller 115 (e.g., a controller external to the memory device 130), may be a memory controller or other external host device. In one embodiment, the memory sub-system controller 115 includes erase manager 134, which can implement the loop dependent erase bias voltage adjustments applied to the first select gate (SGS0) and the second select gate (SGS1) during an erase operation to erase a set of memory cells of memory device 130, as described herein.

Memory device 130 includes an array of memory cells 150 logically arranged in rows and columns. Memory cells of a logical row are typically connected to the same access line (e.g., a wordline) while memory cells of a logical column are typically selectively connected to the same data line (e.g., a bitline). A single access line may be associated with more than one logical row of memory cells and a single data line may be associated with more than one logical column. Memory cells (not shown in FIG. 1B) of at least a portion of array of memory cells 250 are capable of being programmed to one of at least two target data states.

Row decode circuitry 108 and column decode circuitry 110 are provided to decode address signals. Address signals are received and decoded to access the array of memory cells 150. Memory device 130 also includes input/output (I/O) control circuitry 112 to manage input of commands, addresses and data to the memory device 130 as well as output of data and status information from the memory device 130. An address register 114 is in communication with I/O control circuitry 212 and row decode circuitry 108 and column decode circuitry 110 to latch the address signals prior to decoding. A command register 124 is in communication with I/O control circuitry 112 and local media controller 135 to latch incoming commands.

A controller (e.g., the local media controller 135 internal to the memory device 130) controls access to the array of memory cells 150 in response to the commands and generates status information for the external memory sub-system controller 115, i.e., the local media controller 135 is configured to perform access operations (e.g., read operations, programming operations and/or erase operations) on the array of memory cells 150. The local media controller 135 is in communication with row decode circuitry 108 and column decode circuitry 110 to control the row decode circuitry 108 and column decode circuitry 110 in response to the addresses.

The local media controller 135 is also in communication with a cache register 118. Cache register 118 latches data, either incoming or outgoing, as directed by the local media controller 135 to temporarily store data while the array of memory cells 150 is busy writing or reading, respectively, other data. During a program operation (e.g., write operation), data may be passed from the cache register 118 to the data register 109 for transfer to the array of memory cells 150; then new data may be latched in the cache register 118 from the I/O control circuitry 212. During a read operation, data may be passed from the cache register 118 to the I/O control circuitry 112 for output to the memory sub-system controller 115; then new data may be passed from the data register 109 to the cache register 118. The cache register 118 and/or the data register 109 may form (e.g., may form a portion of) a page buffer of the memory device 130. A page buffer may further include sensing devices (not shown in FIG. 1B) to sense a data state of a memory cell of the array of memory cells 150, e.g., by sensing a state of a data line connected to that memory cell. A status register 122 may be in communication with I/O control circuitry 112 and the local memory controller 135 to latch the status information for output to the memory sub-system controller 115.

Memory device 130 receives control signals at the memory sub-system controller 115 from the local media controller 135 over a control link 132. For example, the control signals can include a chip enable signal CE #, a command latch enable signal CLE, an address latch enable signal ALE, a write enable signal WE #, a read enable signal RE #, and a write protect signal WP #. Additional or alternative control signals (not shown) may be further received over control link 132 depending upon the nature of the memory device 130. In one embodiment, memory device 130 receives command signals (which represent commands), address signals (which represent addresses), and data signals (which represent data) from the memory sub-system controller 115 over a multiplexed input/output (I/O) bus 131 and outputs data to the memory sub-system controller 115 over I/O bus 131.

For example, the commands may be received over input/output (I/O) pins [7:0] of I/O bus 131 at I/O control circuitry 112 and may then be written into command register 124. The addresses may be received over input/output (I/O) pins [7:0] of I/O bus 234 at I/O control circuitry 112 and may then be written into address register 114. The data may be received over input/output (I/O) pins [7:0] for an 8-bit device or input/output (I/O) pins [15:0] for a 16-bit device at I/O control circuitry 112 and then may be written into cache register 118. The data may be subsequently written into data register 109 for programming the array of memory cells 150.

In an embodiment, cache register 118 may be omitted, and the data may be written directly into data register 109. Data may also be output over input/output (I/O) pins [7:0] for an 8-bit device or input/output (I/O) pins [15:0] for a 16-bit device. Although reference may be made to I/O pins, they may include any conductive node providing for electrical connection to the memory device 130 by an external device (e.g., the memory sub-system controller 115), such as conductive pads or conductive bumps as are commonly used.

It will be appreciated by those skilled in the art that additional circuitry and signals can be provided, and that the memory device 130 of FIG. 1B has been simplified. It should be recognized that the functionality of the various block components described with reference to FIG. 1B may not necessarily be segregated to distinct components or component portions of an integrated circuit device. For example, a single component or component portion of an integrated circuit device could be adapted to perform the functionality of more than one block component of FIG. 1B. Alternatively, one or more components or component portions of an integrated circuit device could be combined to perform the functionality of a single block component of FIG. 1B. Additionally, while specific I/O pins are described in accordance with popular conventions for receipt and output of the various signals, it is noted that other combinations or numbers of I/O pins (or other I/O node structures) may be used in the various embodiments.

Figure 2A:
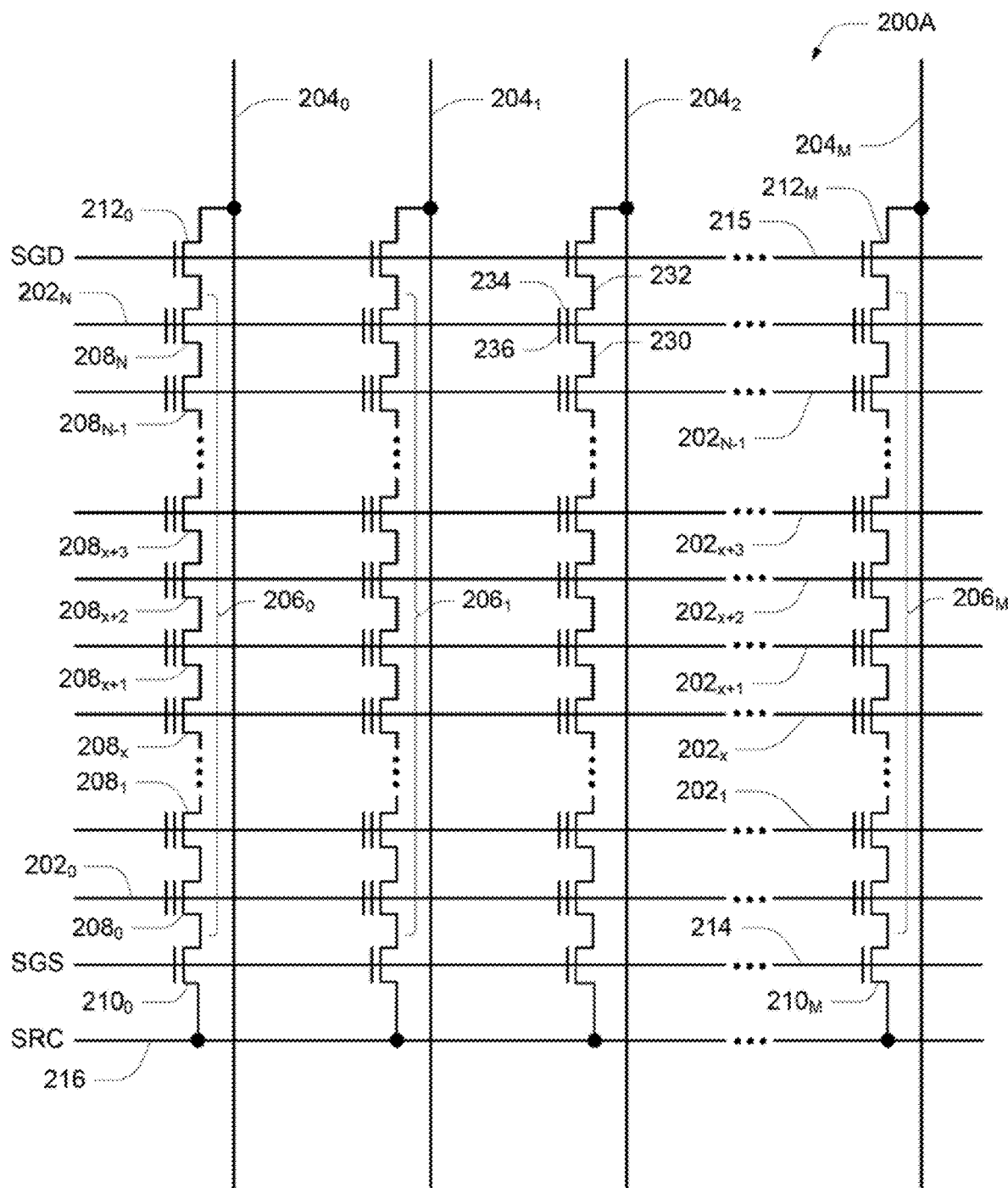
FIG. 2A-2C are schematics of portions of an array of memory cells as could be used in a memory of the type described with reference to FIG. 1B according to an embodiment.
Figure 2B:
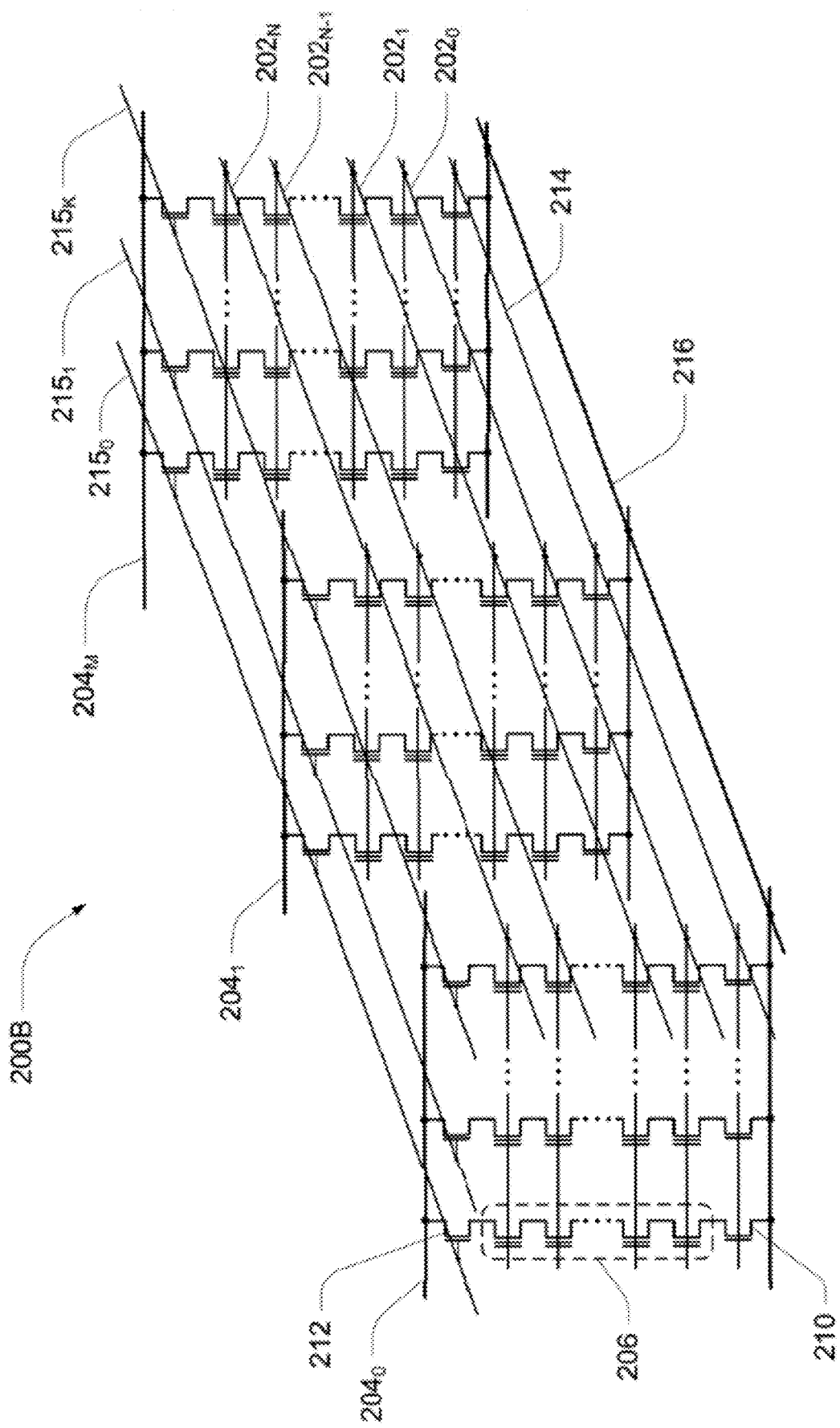
Figure 2C:
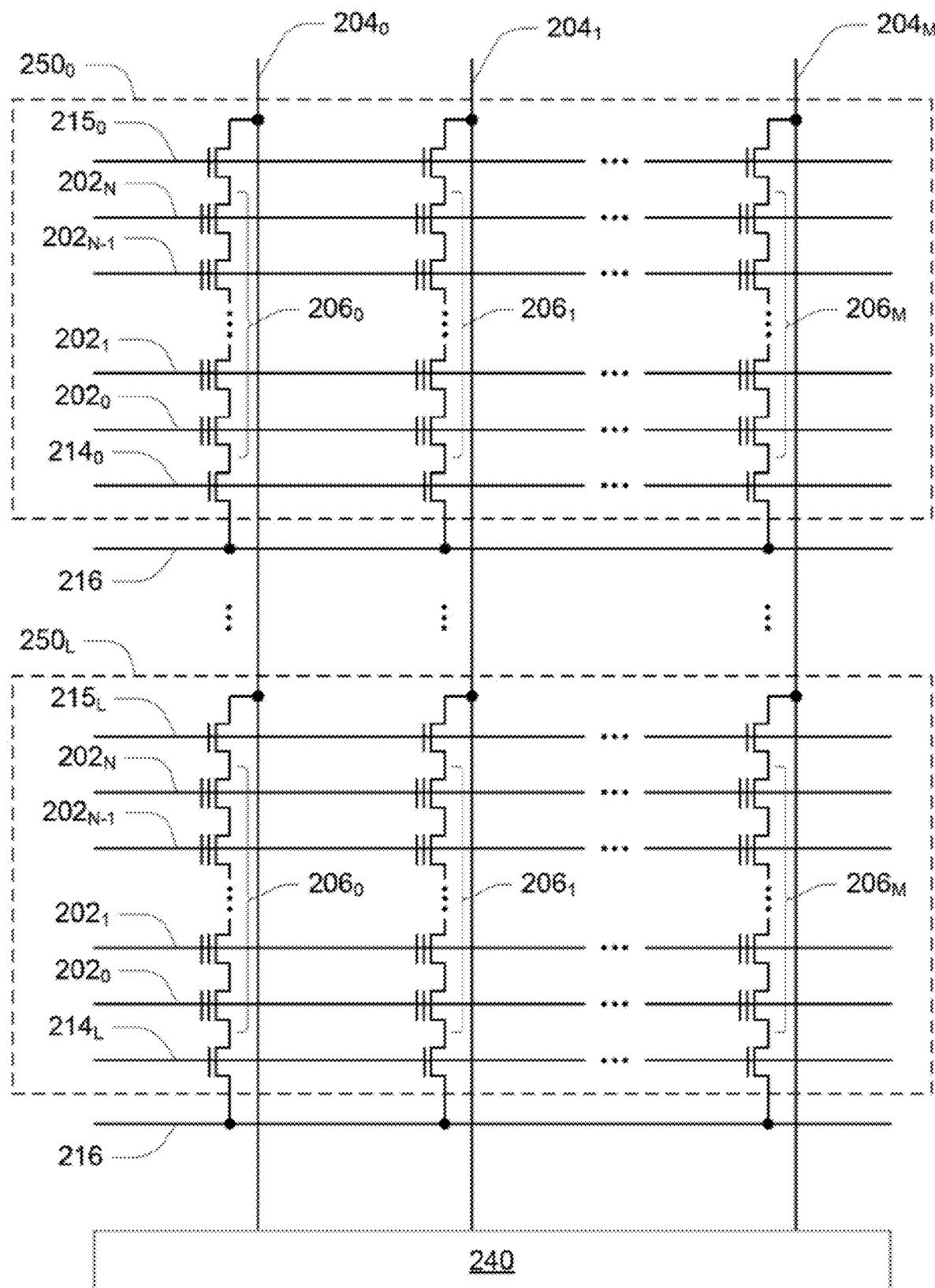

FIG. 2A-2C are schematics of portions of an array of memory cells 200A, such as a NAND memory array, as could be used in a memory of the type described with reference to FIG. 1B according to an embodiment, e.g., as a portion of the array of memory cells 104. Memory array 200A includes access lines, such as wordlines $202_0$ to $202_N$, and data lines, such as bitlines $204_0$ to $204_M$. The wordlines 202 can be connected to global access lines (e.g., global wordlines), not shown in FIG. 2A, in a many-to-one relationship. For some embodiments, memory array 200A can be formed over a semiconductor that, for example, can be conductively doped to have a conductivity type, such as a p-type conductivity, e.g., to form a p-well, or an n-type conductivity, e.g., to form an n-well.

Memory array 200A can be arranged in rows (each corresponding to a wordline 202) and columns (each corresponding to a bitline 204). Each column can include a string of series-connected memory cells (e.g., non-volatile memory cells), such as one of NAND strings $206_0$ to $206_M$. Each NAND string 206 can be connected (e.g., selectively connected) to a common source (SRC) 216 and can include memory cells $208_0$ to $208_N$. The memory cells 208 can represent non-volatile memory cells for storage of data. The memory cells 208 of each NAND string 206 can be connected in series between a select gate 210 (e.g., a field-effect transistor), such as one of the select gates $210_0$ to $210_M$ (e.g., that can be source select transistors, commonly referred to as select gate source), and a select gate 212 (e.g., a field-effect transistor), such as one of the select gates $212_0$ to $212_M$ (e.g., that can be drain select transistors, commonly referred to as select gate drain). Source-side select gates $210_0$ to $210_M$ can be commonly connected to a select line 214, such as a source select line, and drain-side select gates (SGD) $212_0$ to $212_M$ can be commonly connected to a select line 215, such as a drain select line. Although depicted as traditional field-effect transistors, the select gates 210 and 212 can utilize a structure similar to (e.g., the same as) the memory cells 208. The select gates 210 and 212 can represent a number of select gates connected in series, with each select gate in series configured to receive a same or independent control signal.

A source of each select gate 210 can be connected to common source 216. The drain of each select gate 210 can be connected to a memory cell $208_0$ of the corresponding NAND string 206. For example, the drain of select gate $210_0$ can be connected to memory cell $208_0$ of the corresponding NAND string $206_0$. Therefore, each select gate 210 can be configured to selectively connect a corresponding NAND string 206 to the common source 216. A control gate of each select gate 210 can be connected to the select line 214.

The drain of each select gate 212 can be connected to the bitline 204 for the corresponding NAND string 206. For example, the drain of select gate $212_0$ can be connected to the bitline $204_0$ for the corresponding NAND string $206_0$. The source of each select gate 212 can be connected to a memory cell $208_N$ of the corresponding NAND string 206. For example, the source of select gate $212_0$ can be connected to memory cell $208_N$ of the corresponding NAND string $206_0$. Therefore, each select gate 212 can be configured to selectively connect a corresponding NAND string 206 to the corresponding bitline 204. A control gate of each select gate 212 can be connected to select line 215.

The memory array 200A in FIG. 2A can be a quasi-two-dimensional memory array and can have a generally planar structure, e.g., where the common source 216, NAND strings 206 and bitlines 204 extend in substantially parallel planes. Alternatively, the memory array 200A in FIG. 2A can be a three-dimensional memory array, e.g., where NAND strings 206 can extend substantially perpendicular to a plane containing the common source 216 and to a plane containing the bitlines 204 that can be substantially parallel to the plane containing the common source 216.

Typical construction of memory cells 208 includes a data-storage structure 234 (e.g., a floating gate, charge trap, and the like) that can determine a data state of the memory cell (e.g., through changes in threshold voltage), and a control gate 236, as shown in FIG. 2A. The data-storage structure 234 can include both conductive and dielectric structures while the control gate 236 is generally formed of one or more conductive materials. In some cases, memory cells 208 can further have a defined source/drain (e.g., source) 230 and a defined source/drain (e.g., drain) 232. The memory cells 208 have their control gates 236 connected to (and in some cases form) a wordline 202.

A column of the memory cells 208 can be a NAND string 206 or a number of NAND strings 206 selectively connected to a given bitline 204. A row of the memory cells 208 can be memory cells 208 commonly connected to a given wordline 202. A row of memory cells 208 can, but need not, include all the memory cells 208 commonly connected to a given wordline 202. Rows of the memory cells 208 can often be divided into one or more groups of physical pages of memory cells 208, and physical pages of the memory cells 208 often include every other memory cell 208 commonly connected to a given wordline 202. For example, the memory cells 208 commonly connected to wordline $202_N$ and selectively connected to even bitlines 204 (e.g., bitlines $204_0$, $204_2$, $204_4$, etc.) can be one physical page of the memory cells 208 (e.g., even memory cells) while memory cells 208 commonly connected to wordline $202_N$ and selectively connected to odd bitlines 204 (e.g., bitlines $204_1$, $204_3$, $204_5$, etc.) can be another physical page of the memory cells 208 (e.g., odd memory cells).

Although bitlines $204_3$-$204_5$ are not explicitly depicted in FIG. 2A, it is apparent from the figure that the bitlines 204 of the array of memory cells 200A can be numbered consecutively from bitline $204_0$ to bitline $204_M$. Other groupings of the memory cells 208 commonly connected to a given wordline 202 can also define a physical page of memory cells 208. For certain memory devices, all memory cells commonly connected to a given wordline can be deemed a physical page of memory cells. The portion of a physical page of memory cells (which, in some embodiments, could still be the entire row) that is read during a single read operation or programmed during a single programming operation (e.g., an upper or lower page of memory cells) can be deemed a logical page of memory cells. A block of memory cells can include those memory cells that are configured to be erased together, such as all memory cells connected to wordlines $202_0$-$202_N$ (e.g., all NAND strings 206 sharing common wordlines 202). Unless expressly distinguished, a reference to a page of memory cells herein refers to the memory cells of a logical page of memory cells. Although the example of FIG. 2A is discussed in conjunction with NAND flash, the embodiments and concepts described herein are not limited to a particular array architecture or structure, and can include other structures (e.g., SONOS, phase change, ferroelectric, etc.) and other architectures (e.g., AND arrays, NOR arrays, etc.).

FIG. 2B is another schematic of a portion of an array of memory cells 200B as could be used in a memory of the type described with reference to FIG. 1B, e.g., as a portion of the array of memory cells 104. Like numbered elements in FIG. 2B correspond to the description as provided with respect to FIG. 2A. FIG. 2B provides additional detail of one example of a three-dimensional NAND memory array structure. The three-dimensional NAND memory array 200B can incorporate vertical structures which can include semiconductor pillars where a portion of a pillar can act as a channel region of the memory cells of NAND strings 206. The NAND strings 206 can be each selectively connected to a bitline $204_0$-$204_M$ by a select transistor 212 (e.g., that can be drain select transistors, commonly referred to as select gate drain) and to a common source 216 by a select transistor 210 (e.g., that can be source select transistors, commonly referred to as select gate source). Multiple NAND strings 206 can be selectively connected to the same bitline 204. Subsets of NAND strings 206 can be connected to their respective bitlines 204 by biasing the select lines $215_0$-$215_K$ to selectively activate particular select transistors 212 each between a NAND string 206 and a bitline 204. The select transistors 210 can be activated by biasing the select line 214. Each wordline 202 can be connected to multiple rows of memory cells of the memory array 200B. Rows of memory cells that are commonly connected to each other by a particular wordline 202 can collectively be referred to as tiers.

FIG. 2C is a further schematic of a portion of an array of memory cells 200C as could be used in a memory of the type described with reference to FIG. 1B, e.g., as a portion of the array of memory cells 104. Like numbered elements in FIG. 2C correspond to the description as provided with respect to FIG. 2A. The array of memory cells 200C can include strings of series-connected memory cells (e.g., NAND strings) 206, access (e.g., word) lines 202, data (e.g., bit) lines 204, select lines 214 (e.g., source select lines), select lines 215 (e.g., drain select lines) and a source 216 as depicted in FIG. 2A. A portion of the array of memory cells 200A can be a portion of the array of memory cells 200C, for example.

FIG. 2C depicts groupings of NAND strings 206 into blocks of memory cells 250, e.g., blocks of memory cells $250_0$-$250_L$. Blocks of memory cells 250 can be groupings of memory cells 208 that can be erased together in a single erase operation, sometimes referred to as erase blocks. Each block of memory cells 250 can represent those NAND strings 206 commonly associated with a single select line 215, e.g., select line $215_0$. The source 216 for the block of memory cells $250_0$ can be a same source as the source 216 for the block of memory cells $250_L$. For example, each block of memory cells $250_0$-$250_L$ can be commonly selectively connected to the source 216. Access lines 202 and select lines 214 and 215 of one block of memory cells 250 can have no direct connection to access lines 202 and select lines 214 and 215, respectively, of any other block of memory cells of the blocks of memory cells $250_0$-$250_L$.

The bitlines $204_0$-$204_M$ can be connected (e.g., selectively connected) to a buffer portion 240, which can be a portion of the page buffer 152 of the memory device 130. The buffer portion 240 can correspond to a memory plane (e.g., the set of blocks of memory cells $250_0$-$250_L$). The buffer portion 240 can include sense circuits (which can include sense amplifiers) for sensing data values indicated on respective bitlines 204.

Figure 3:
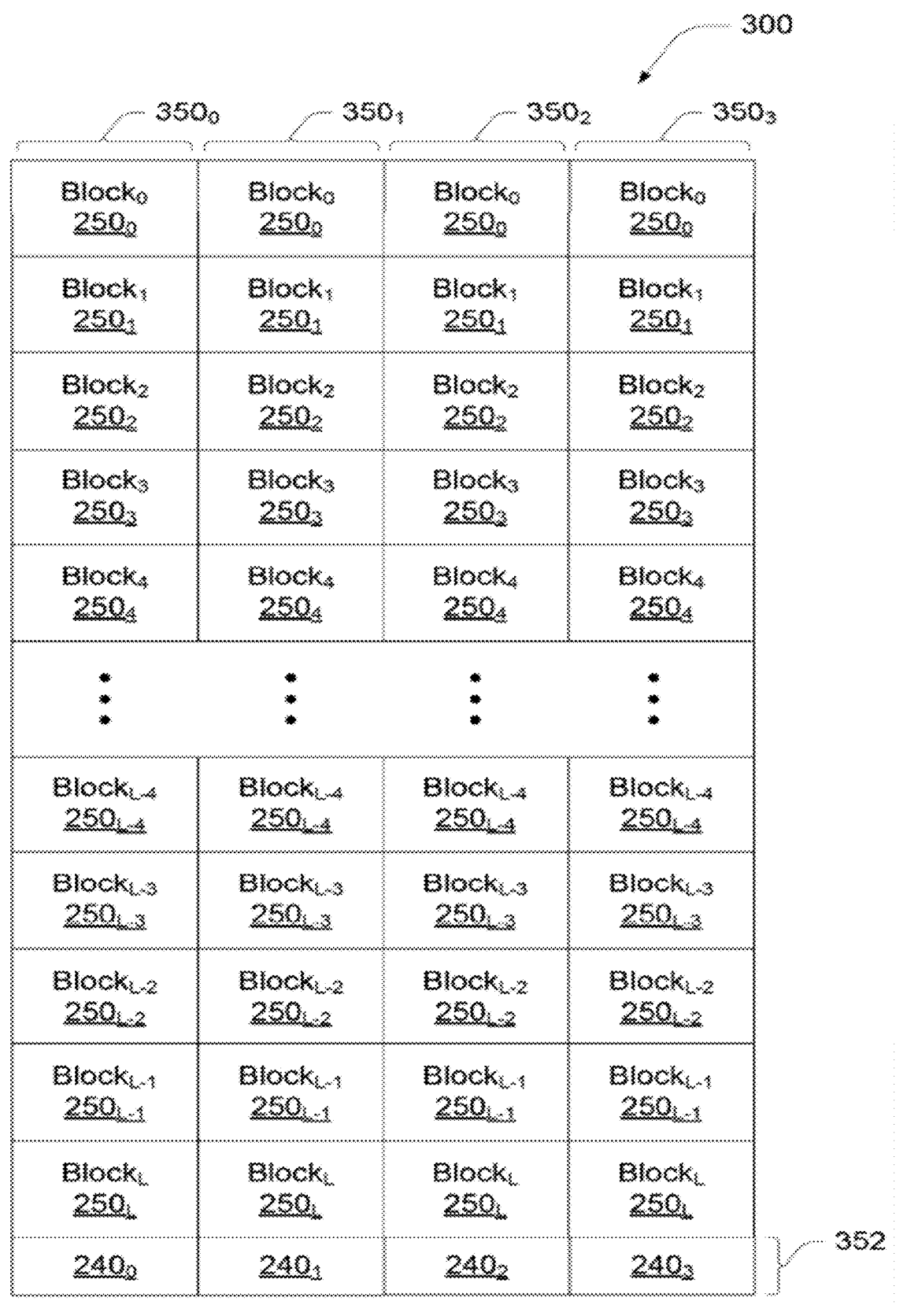

FIG. 3 is a block schematic of a portion of an array of memory cells 300 as could be used in a memory of the type described with reference to FIG. 1B. The array of memory cells 300 is depicted as having four memory planes 350 (e.g., memory planes $350_0$-$350_3$), each in communication with a respective buffer portion 240, which can collectively form a page buffer 352. While four memory planes 350 are depicted, other numbers of memory planes 350 can be commonly in communication with a page buffer 352. Each memory plane 350 is depicted to include L+1 blocks of memory cells 250 (e.g., blocks of memory cells $250_0$-$250_L$).

Figure 4:
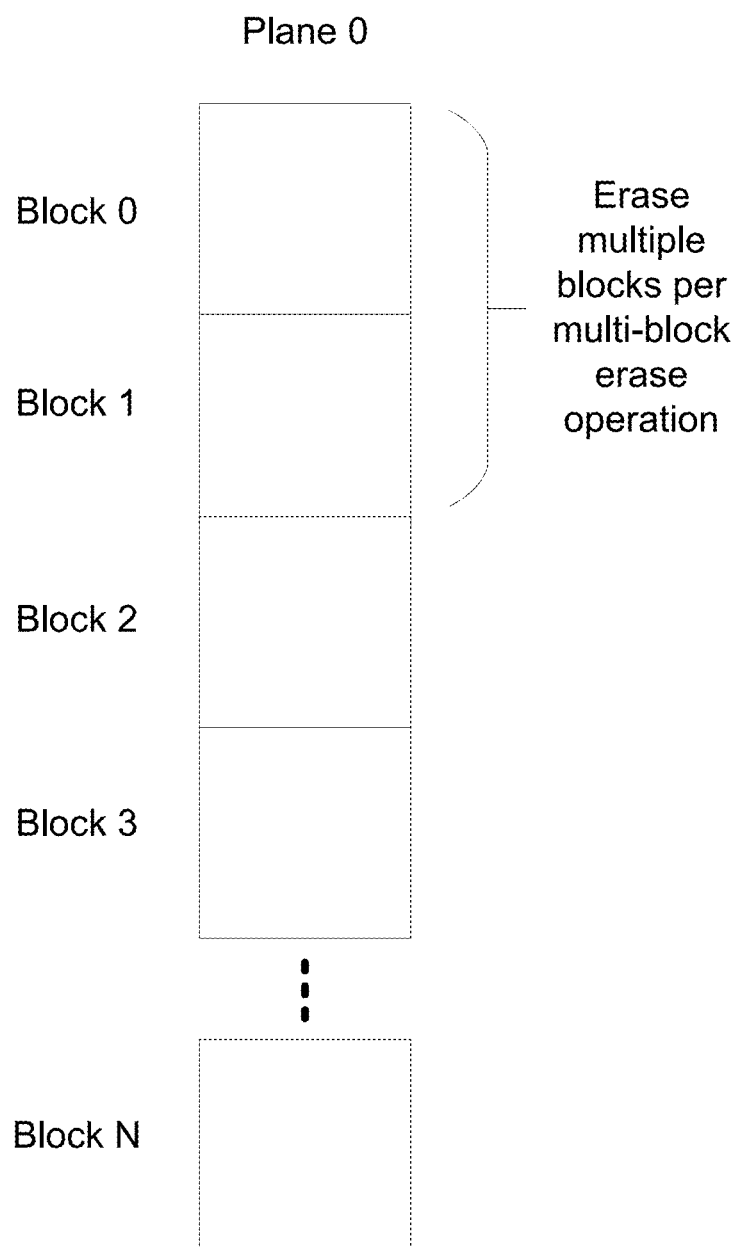
FIG. 4 illustrates an example multi-block erase operation executed with respect to a set of memory blocks of a memory plane of a memory device, in accordance with one or more embodiments of the present disclosure.

FIG. 4 illustrates an example multi-block erase operation executed with respect to a set of memory blocks (e.g., memory blocks 0, 1, 2, 3 . . . N) of a memory plane (e.g., Plane 0) of a memory device. According to an embodiment, the multi-block erase operation is executed to erase multiple memory blocks concurrently (e.g., erase block 0 and block 1 with a single multi-block erase operation). In an embodiment, the erase pulses of the multi-block erase operation are applied to a set of target memory cells to be erased, where the target memory cells are located in a first target memory block (e.g., block 0) and a second target memory block (e.g., block 1).

Figure 5:
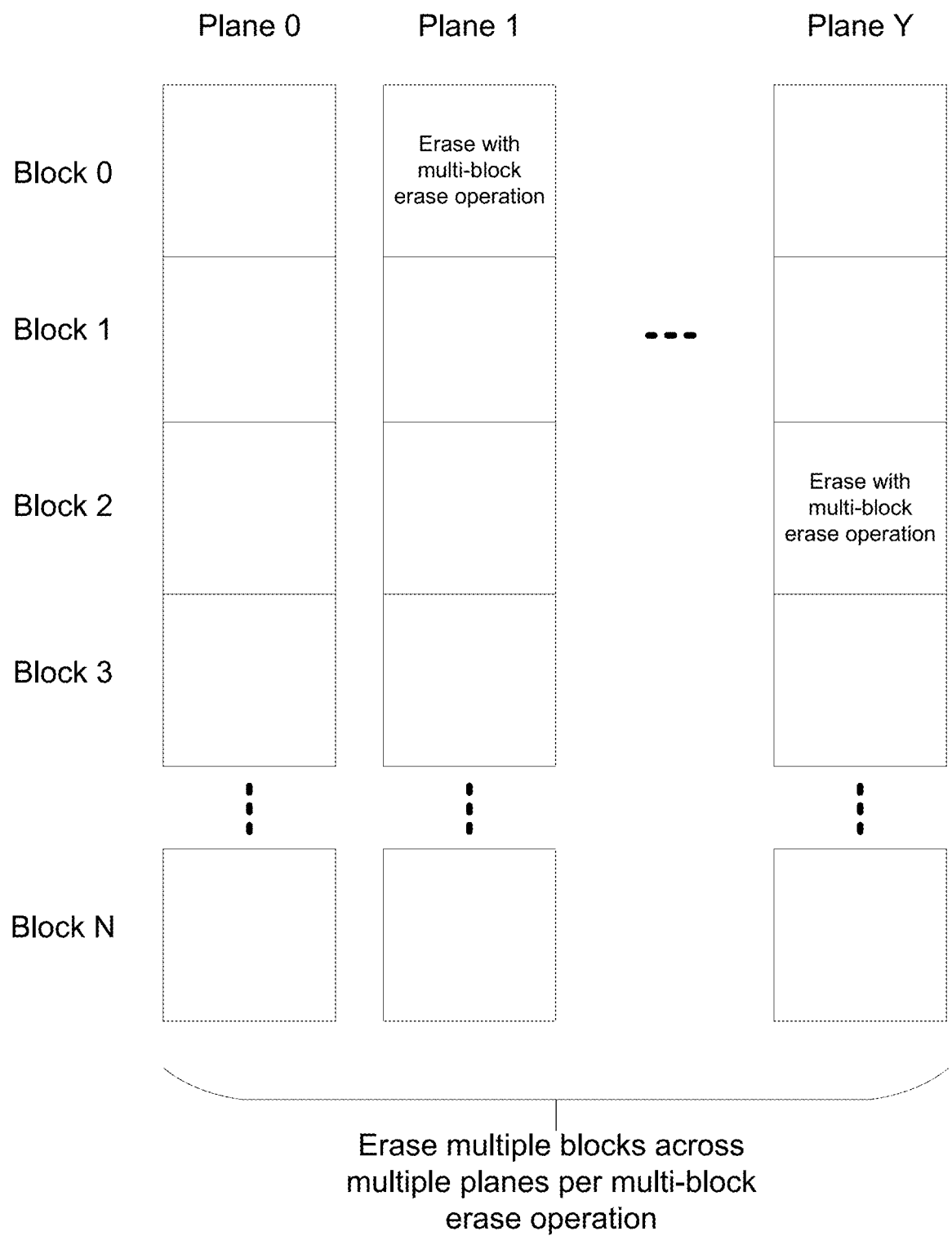
FIG. 5 illustrates an example multi-block erase operation executed with respect to a set of memory blocks of multiple memory planes of a memory device, in accordance with one or more embodiments of the present disclosure.

FIG. 5 illustrates an example multi-block erase operation executed with respect to a set of memory blocks (e.g., memory blocks 0, 1, 2, 3 . . . N) of multiple memory planes (e.g., Plane 0, Plane 1 . . . Plane Y) of a memory device. According to an embodiment, the multi-block erase operation is executed to erase multiple memory blocks of multiple different memory planes concurrently (e.g., erase block 0 of Plane 1 and erase block 2 of Plane Y with a single multi-block erase operation). In an embodiment, the erase pulses are concurrently applied to the identified target memory blocks of the memory planes. Advantageously, the multi-block erase operation in accordance with FIG. 5 is executed to concurrently erase approximately 232 MB (i.e., the data size of the multiple blocks) per each erase operation. Accordingly, the erase time (Terase) corresponding to the erase of multiple memory blocks is reduced, which reduces the throughput impact associated with erase operations by approximately 50%.

Figure 6:
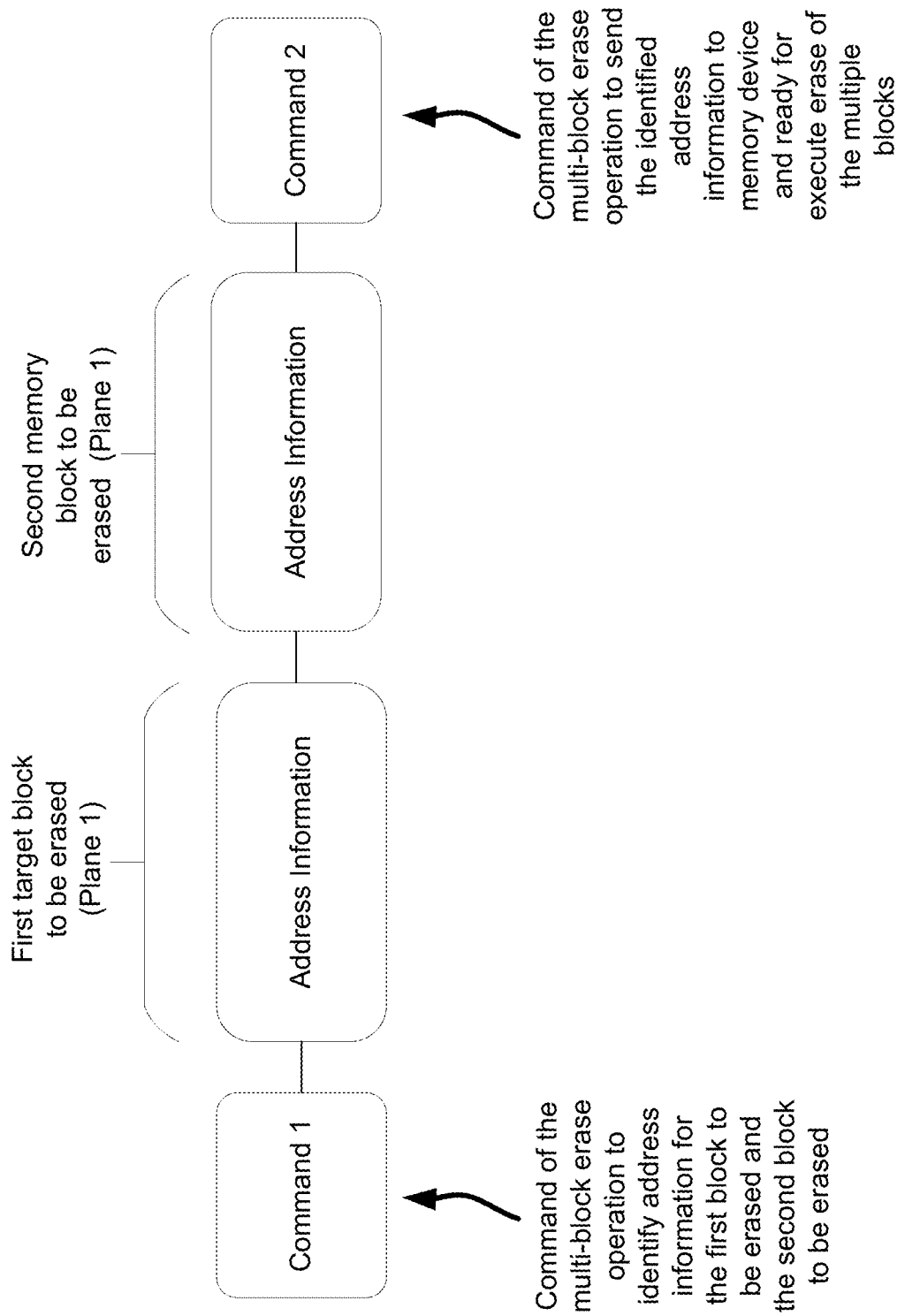
FIG. 6 illustrates an example sequence associated with a multi-block erase operation, according to one or more embodiments of the present disclosure.

FIG. 6 illustrates an example sequence associated with a multi-block erase operation, according to embodiments of the present disclosure. As shown in FIG. 6, a first command (e.g., command 1) is issued to identify address information for a first memory block to be erased (i.e., a first target memory block) and a second memory block to be erased (i.e., a second target memory block). In an embodiment, following collection of the first target memory block and the second target memory block address information, processing logic (e.g., processing logic of a memory sub-system controller) issues a second command (e.g., command 2) to initiate the multi-block erase operation to concurrently erase the first target block and the second target block. In an embodiment, the second command initiates the sending of the address information to the memory device including the first target memory block and the second memory block and enables the memory device to prepare the target memory blocks for the multi-block erase operation, as described herein.

Figure 7:
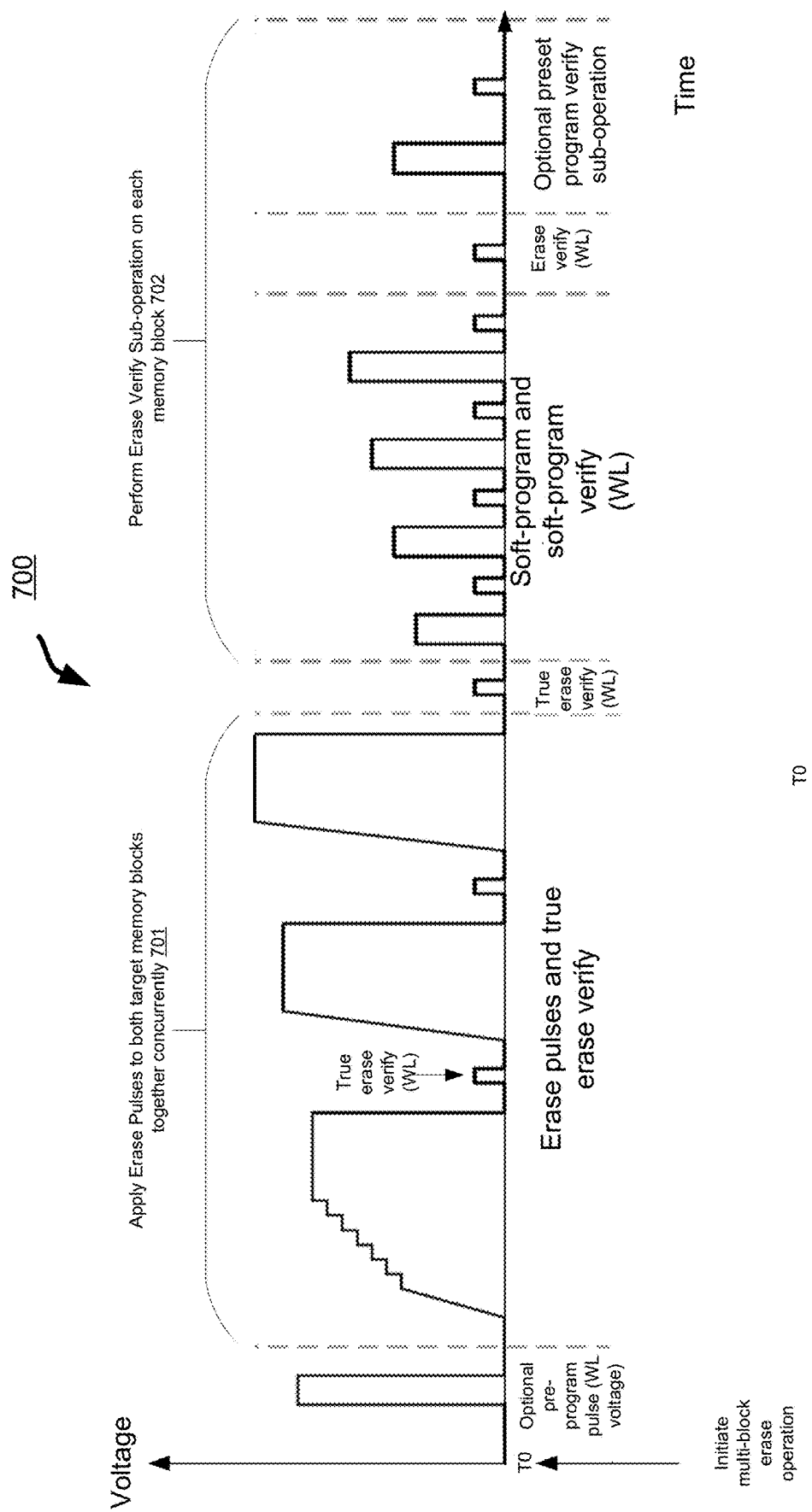
FIG. 7 illustrates an example waveform depiction of a multi-block erase operation, according to one or more embodiments of the present disclosure.

FIG. 7 illustrates an example waveform depiction 700 of a multi-block erase operation, according to embodiments of the present disclosure. As shown in FIG. 7, the erase manager can initiate the multi-block erase operation at a first time T0 to erase a set of target memory cells associated with a first target memory block and a second target memory block (e.g., in response to the second command of FIG. 6). During a pre-program sub-operation, which is optional, a pre-program pulse can be applied to the one or more wordlines of the target memory cells to pre-condition the memory array to avoid over-erasing. In some embodiments, the memory cells that are targeted for the multi-block erase operation are organized as multiple physical blocks of memory cells.

According to embodiments, in a first stage 701, the multi-block erase operation includes a true erase sub-operation during which the erase manager 134 causes one or more erase pulses to be applied to the set of target memory cells of the first target memory block and the second target memory block concurrently. In an embodiment, the true erase sub-operation causes a common source voltage line associated with each of the first target memory block and the second target memory block to be ramped to an erase voltage (Vera) with one or more an erase pulse while select gates (e.g., SGS transistors) are turned on.

According to embodiments, following each erase pulse, the multi-block erase operation can include executing a corresponding true erase verify sub-operation. In an embodiment, during a true erase verify sub-operation, the erase manager 134 can determine whether the threshold voltage (Vt) distribution of the erased memory cells of the multiple memory blocks is below a true erase verify threshold voltage (e.g., a small negative voltage ($-V_L$), e.g., $-1.5$, $-1.25$V, $-1.0$V, or the like. If the Vt distribution of the target memory cells of the first target memory block and the second target memory block includes some portion that meets or exceeds the true erase verify threshold voltage ($-$VL), the true erase verify sub-operation can be considered to have failed. Advantageously, the multi-block erase operation includes application of the set of erase pulses to both the first target memory block and the second target memory block concurrently.

In an embodiment, after the true verify operation passes (i.e., the Vt levels of the target memory cells of the first target memory block and the second target memory block are below the true erase verify threshold voltage), such as at time T1 in FIG. 7, during a second stage 702, the multi-block erase operation can include a series of erase/program verify sub-operations to ensure the target memory cells of the first target memory block and the second target memory block have a voltage distribution around a particular threshold voltage range, e.g., below and/or around a small negative voltage ($-$VL), e.g., $-1.5$, $-1.25$V, $-1.0$V, or the like. These different verify sub-operations can include a soft-program sub-operation, a soft-program verify sub-operation, and a final erase verify sub-operation, and, optionally, a preset program verify operation.

In an embodiment, the soft-program verify sub-operation can be applied between soft program operations, which includes causing application of a series of low-voltage program pulses to bring the erase state of the Vt distribution closer to the true ease verify threshold level ($-$VL), but still below 0V. Any cells of the group of erased memory cells that happen to be programmed to higher than $-$VL during a soft program can be locked out, e.g., inhibited during a next soft-program verify sub-operation.

In an embodiment, the multi-block erase operation can include a final erase verify sub-operation. During the final erase verify sub-operation, the erase manager 134 can ensure the Vt distribution of the group of erased memory cells is still below a final erase threshold voltage level (e.g., a negative voltage that is smaller than the true erase verify threshold voltage level (e.g., −VL/2 or approximately one half of −VL). If any part of the Vt distribution meets or exceeds −VL/2, then the final erase verify sub-operation can be considered to have failed. In an embodiment, the erase verify sub-operation stage 702 can include a preset program verify operation (e.g., applied to an edge wordline, such as wordline 0 and wordline 65).

Figure 8:
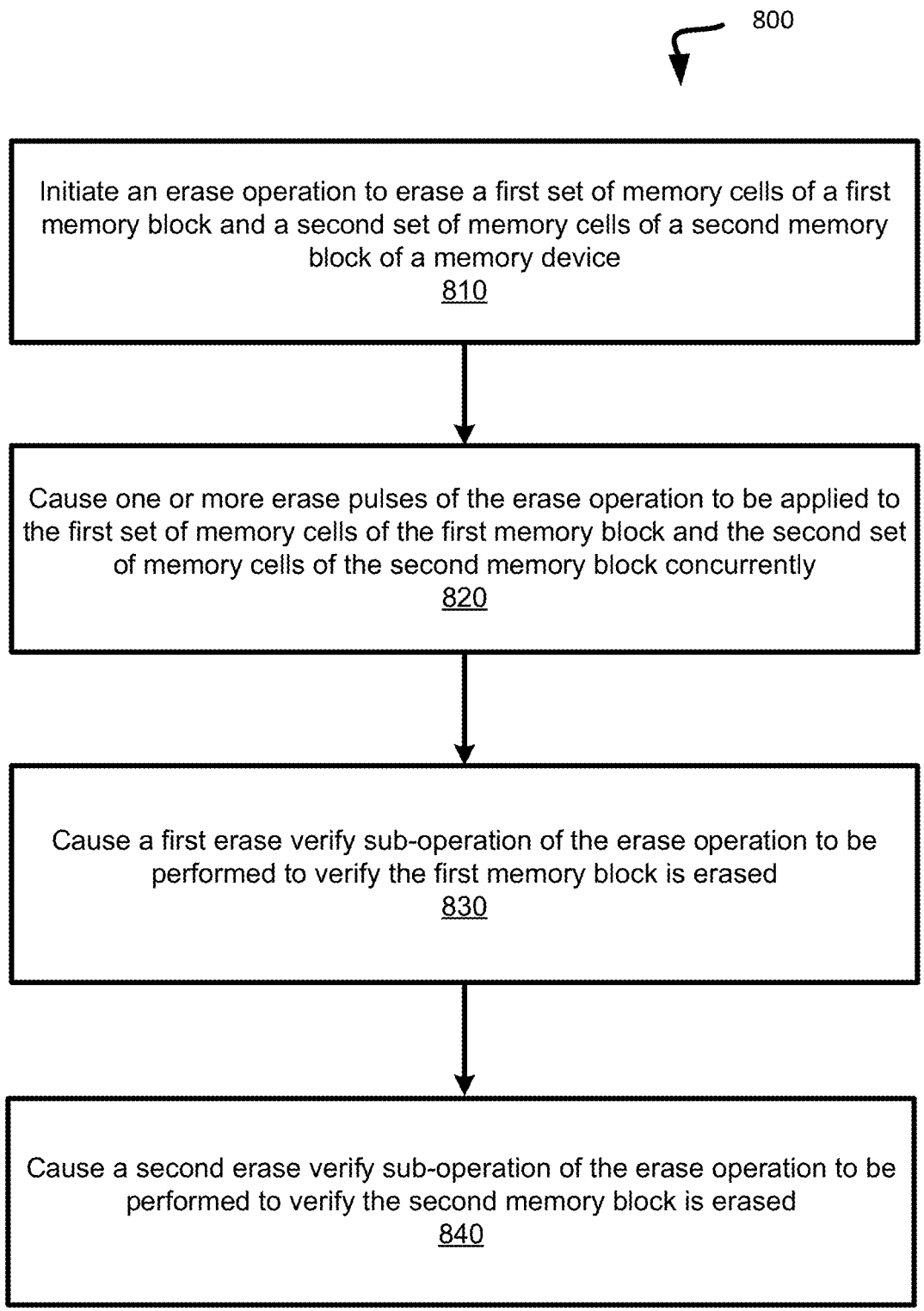
FIG. 8 illustrates an example process relating to an erase operation to erase a set of memory cells of multiple memory blocks of a memory device, in accordance with one or more embodiments of the present disclosure.

FIG. 8 illustrates an example process 800 relating to an erase operation to erase a set of memory cells of multiple memory blocks of a memory device, according to embodiments of the present disclosure. The method 800 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 800 is performed by erase manager 134 of FIG. 1A and FIG. 1B. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 810, an operation is initiated. For example, processing logic (e.g., erase manager 134) can initiate an erase operation to erase a first set of memory cells of a first memory block and a second set of memory cells of a second memory block of a memory device. In an embodiment, the processing logic of a memory sub-system controller 115 can receive, from a requestor, such as a host system 120 a request to perform the erase operation on the first set of memory cells of a first memory block and a second set of memory cells of a second memory block, such as a set memory cells of memory array 250, of a memory device, such as memory device 130. In an embodiment, the first set of memory cells of the first memory block and the second set of memory cells of the second memory block are collectively referred to as the set of target memory cells.

At operation 820, one or more erase pulses are applied. For example, processing logic causes one or more erase pulses of the erase operation to be applied to the first set of memory cells of the first memory block and the second set of memory cells of the second memory block concurrently. In an embodiment, the erase pulses are applied to the first memory block and the second memory block at the same time, which reduces the erase time (Terase) as compared to an erase operation that erases a single memory block at a time. In an embodiment, the first memory block and the second memory block can be part of a same memory plane (e.g., as shown in the example of FIG. 4). In an embodiment, the first memory block and the second memory block can be part of different memory planes (e.g., the first memory block is part of a first memory plane and a second memory block is part of a second memory plane, as shown in the example of FIG. 5). In an embodiment, the one or more erase pulses includes a first erase pulse and a second erase pulse. In an embodiment, the first erase pulse is applied to both the first memory block and the second memory block for approximately 2 ms and the second erase pulse is applied to both the first memory block and the second memory block for approximately 1.8 ms. In an embodiment, a total time the one or more erase pulses are applied to the first memory block and the second memory block concurrently for a period of approximately 2.5 ms (i.e., at a beginning-of-life of the memory device) to approximately 10 ms (i.e., at an end-of-life of the memory device). In an embodiment, during certain post-cycling block erase operations, the time duration of the one or more erase pulses can exceed 10 ms. Accordingly, a reduction in the time duration can be realized by using the multi-block erase operation during a post-cycling stage.

At operation 830, an operation is performed. For example, the processing logic causes a first erase verify sub-operation to be performed to verify the first memory block is erased. In an embodiment, the first erase verify sub-operation confirms that the voltage levels associated with the first memory block reached an erase program verify threshold voltage.

At operation 840, an operation is performed. For example, the processing logic causes a second erase verify sub-operation to be performed to verify the second memory block is erased. According to an embodiment, the second erase verify sub-operation confirms that the voltage levels associated with the second memory block reached the erase program verify threshold voltage. In an embodiment, an erase time (i.e., a time from the initiating of the erase operation to a time the erase is verified) associated with erasing the first memory block and the second memory block is approximately 6 ms. This represents a reduction in the total erase time as compared to a single-block erase operation, which requires 5 ms to erase a single memory block. Advantageously, use of the multi-block erase operation according to the present disclosure reduces the impact on the throughput of the memory device, particularly for low density universal flash storage.

Figure 9:
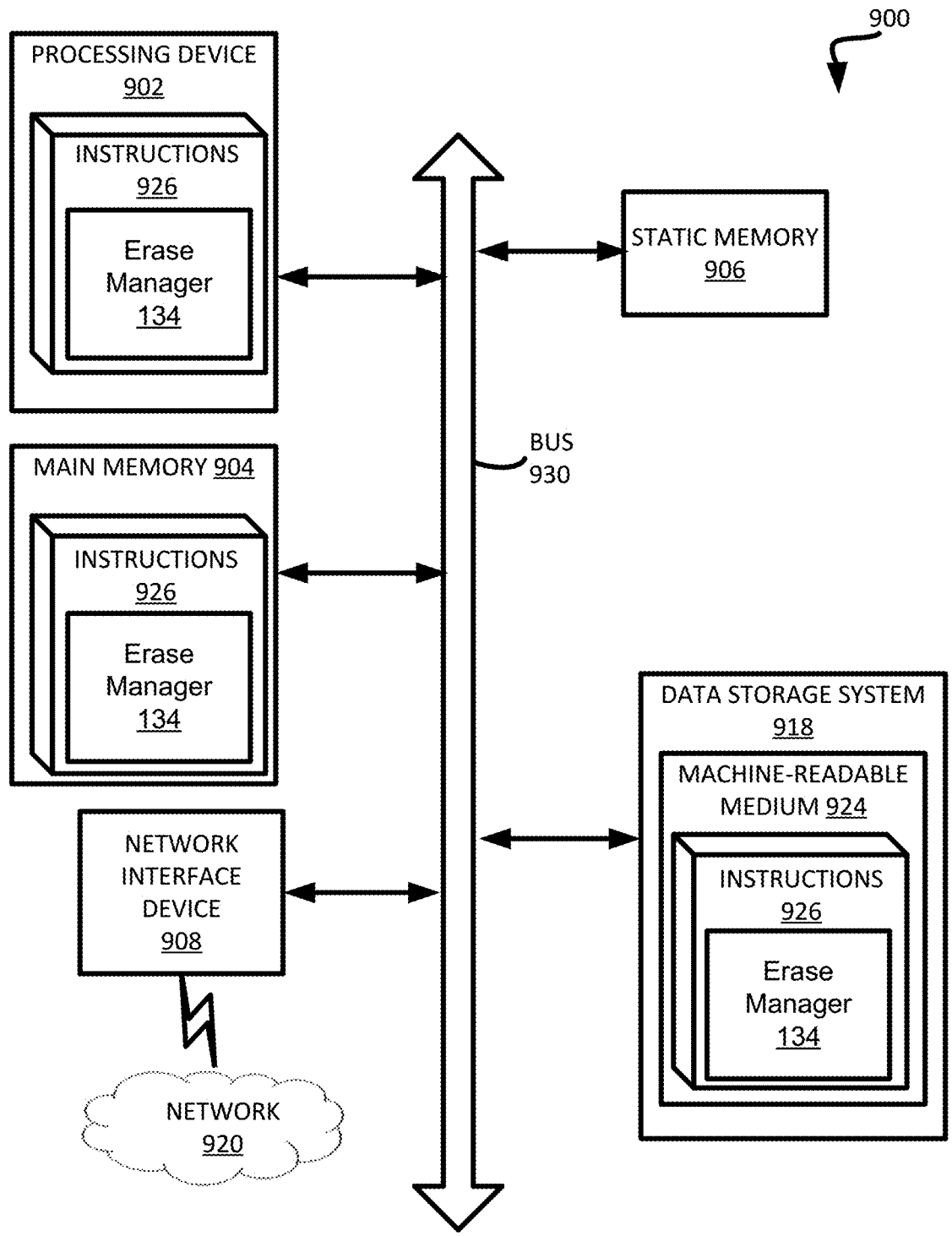
FIG. 9 is a block diagram of an example computer system in which embodiments of the present disclosure can operate.

FIG. 9 illustrates an example machine of a computer system 900 within which a set of instructions, for causing the machine to perform any one or more of the methodologies discussed herein, can be executed. In some embodiments, the computer system 900 can correspond to a host system (e.g., the host system 120 of FIG. 1A) that includes, is coupled to, or utilizes a memory sub-system (e.g., the memory sub-system 110 of FIG. 1A) or can be used to perform the operations of a controller (e.g., to execute an operating system to perform operations corresponding to erase manager 134 of FIG. 1A). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 900 includes a processing device 902, a main memory 904 (e.g., read-only memory (ROM), flash memory, dynamic random access memory (DRAM) such as synchronous DRAM (SDRAM) or Rambus DRAM (RDRAM), etc.), a static memory 906 (e.g., flash memory, static random access memory (SRAM), etc.), and a data storage system 918, which communicate with each other via a bus 930.

Processing device 902 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 902 can also be one or more special-purpose processing devices such as an application specific integrated circuit (ASIC), a field programmable gate array (FPGA), a digital signal processor (DSP), network processor, or the like. The processing device 902 is configured to execute instructions 926 for performing the operations and steps discussed herein. The computer system 900 can further include a network interface device 908 to communicate over the network 920.

The data storage system 918 can include a machine-readable storage medium 924 (also known as a computer-readable medium, such as a non-transitory computer-readable medium) on which is stored one or more sets of instructions 926 or software embodying any one or more of the methodologies or functions described herein. The instructions 926 can also reside, completely or at least partially, within the main memory 904 and/or within the processing device 902 during execution thereof by the computer system 900, the main memory 904 and the processing device 902 also constituting machine-readable storage media. The machine-readable storage medium 924, data storage system 918, and/or main memory 904 can correspond to the memory sub-system 110 of FIGS. 1A and 1B.

In one embodiment, the instructions 926 include instructions to implement functionality corresponding to erase manager 134 of FIGS. 1A and 1B). While the machine-readable storage medium 924 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A system comprising:
a memory device; and
a processing device, operatively coupled with the memory device, to perform operations comprising:
  initiating an erase operation to erase a first set of memory cells of a first memory block and a second set of memory cells of a second memory block of a memory device;
  causing, during a first stage of the erase operation, one or more erase pulses of the erase operation to be applied to the first set of memory cells of the first memory block and the second set of memory cells of the second memory block concurrently, wherein the one or more erase pulses cause a source voltage associated with each of the first memory block and the second memory block to be ramped to an erase voltage level;

causing, during the first stage of the erase operation, one or more first erase verify sub-operations of the erase operation to be performed to verify a first threshold voltage distribution level associated with the first memory block is less than a first erase verify threshold voltage level;

causing, during the first stage of the erase operation, one or more second erase verify sub-operations of the erase operation to be performed to verify a second threshold voltage distribution level associated with the second memory block is less than the first erase verify threshold voltage level; and in response to completion of the first stage of the erase operation, causing, during a second stage of the erase operation, execution of one or more erase/program verify sub-operations to concurrently verify the first memory block and the second memory block are erased.

2. The system of claim 1, wherein the first memory block and the second memory block are located in a same memory plane of the memory device.

3. The system of claim 1, wherein the first memory block is located in a first memory plane and the second memory block is located in a second memory plane.

4. The system of claim 1, the operations further comprising issuing a first command to cause identification of first address information associated with the first set of memory cells of the first memory block and second address information associated with the second set of memory cells of the second memory block.

5. The system of claim 4, the operations further comprising issuing a second command to cause sending of the first address information and the second address information to the memory device.

6. The system of claim 1, wherein the erase operation comprises a pre-program sub-operation executed prior to applying the one or more erase pulses.

7. A method comprising:
initiating, by a processing device, an erase operation to erase a first set of memory cells of a first memory block and a second set of memory cells of a second memory block of a memory device;

causing, during a first stage of the erase operation, one or more erase pulses of the erase operation to be applied to the first set of memory cells of the first memory block and the second set of memory cells of the second memory block concurrently, wherein the one or more erase pulses cause a source voltage associated with each of the first memory block and the second memory block to be ramped to an erase voltage level;

causing, during the first stage of the erase operation, one or more first erase verify sub-operations of the erase operation to be performed to verify a first threshold voltage distribution level associated with the first memory block is less than a first erase verify threshold voltage level;

causing, during the first stage of the erase operation, one or more second erase verify sub-operations of the erase operation to be performed to verify a second threshold voltage distribution level associated with the second memory block is less than the first erase verify threshold voltage level; and in response to completion of the first stage of the erase operation, causing, during a second stage of the erase operation, execution of one or more erase/program verify sub-operations to concurrently verify the first memory block and the second memory block are erased.

8. The method of claim 7, wherein the first memory block and the second memory block are located in a same memory plane of the memory device.

9. The method of claim 7, wherein the first memory block is located in a first memory plane and the second memory block is located in a second memory plane.

10. The method of claim 7, further comprising issuing a first command to cause identification of first address information associated with the first set of memory cells of the first memory block and second address information associated with the second set of memory cells of the second memory block.

11. The method of claim 10, further comprising issuing a second command to cause sending of the first address information and the second address information to the memory device.

12. The method of claim 7, wherein the erase operation comprises a pre-program sub-operation executed prior to applying the one or more erase pulses.

13. A non-transitory computer-readable storage medium comprising instructions that, when executed by a processing device, cause the processing device to perform operations comprising:
initiating an erase operation to erase a first set of memory cells of a first memory block and a second set of memory cells of a second memory block of a memory device;

causing, during a first stage of the erase operation, one or more erase pulses of the erase operation to be applied to the first set of memory cells of the first memory block and the second set of memory cells of the second memory block concurrently, wherein the one or more erase pulses cause a source voltage associated with each of the first memory block and the second memory block to be ramped to an erase voltage level;

causing, during the first stage of the erase operation, one or more first erase verify sub-operations of the erase operation to be performed to verify a first threshold voltage distribution level associated with the first memory block is less than a first erase verify threshold voltage level; erased; and causing, during the first stage of the erase operation, one or more second erase verify sub-operations of the erase operation to be performed to verify a second threshold voltage distribution level associated with the second memory block is less than the first erase verify threshold voltage level; and in response to completion of the first stage of the erase operation, causing, during a second stage of the erase operation, execution of one or more erase/program verify sub-operations to concurrently verify the first memory block and the second memory block are erased.

14. The non-transitory computer-readable storage medium of claim 13, wherein the first memory block and the second memory block are located in a same memory plane of the memory device.

15. The non-transitory computer-readable storage medium of claim 13, wherein the first memory block is located in a first memory plane and the second memory block is located in a second memory plane.

16. The non-transitory computer-readable storage medium of claim 13, the operations further comprising issuing a first command to cause identification of first address information associated with the first set of memory cells of the first memory block and second address information associated with the second set of memory cells of the second memory block.

17. The non-transitory computer-readable storage medium of claim 16, further comprising issuing a second command to cause sending of the first address information and the second address information to the memory device.

18. The non-transitory computer-readable storage medium of claim 17, wherein the erase operation comprises a pre-program sub-operation executed prior to applying the one or more erase pulses.

* * * * *